United States Patent
Takenaka

(10) Patent No.: US 9,209,752 B2
(45) Date of Patent: Dec. 8, 2015

(54) HIGH-FREQUENCY AMPLIFIER

(71) Applicant: Renesas Electronics Corporation, Kawasaki-shi (JP)

(72) Inventor: Isao Takenaka, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/784,607

(22) Filed: Mar. 4, 2013

(65) Prior Publication Data

US 2013/0229237 A1    Sep. 5, 2013

(30) Foreign Application Priority Data

Mar. 5, 2012    (JP) .................................. 2012-047934

(51) Int. Cl.
| | |
|---|---|
| *H03F 1/22* | (2006.01) |
| *H03F 1/32* | (2006.01) |
| *H03F 1/34* | (2006.01) |
| *H03F 3/193* | (2006.01) |
| *H03F 3/26* | (2006.01) |

(52) U.S. Cl.
CPC .................. *H03F 1/22* (2013.01); *H03F 1/223* (2013.01); *H03F 1/226* (2013.01); *H03F 1/3205* (2013.01); *H03F 1/342* (2013.01); *H03F 3/193* (2013.01); *H03F 3/1935* (2013.01); *H03F 3/265* (2013.01); *H03F 2200/144* (2013.01)

(58) Field of Classification Search
CPC ........... H03F 1/22; H03F 1/223; H03F 1/226; H03F 1/24
USPC ............................... 330/98, 99, 100, 310, 311
See application file for complete search history.

(56) References Cited

U.S. PATENT DOCUMENTS

| | | | | |
|---|---|---|---|---|
| 5,742,205 | A | * | 4/1998 | Cowen et al. .................. 330/269 |
| 6,498,533 | B1 | | 12/2002 | Sowlati |
| 6,933,787 | B1 | * | 8/2005 | Kobayashi ..................... 330/311 |
| 7,652,539 | B2 | * | 1/2010 | Gao et al. ....................... 330/311 |
| 2010/0060362 | A1 | | 3/2010 | Kanaya et al. |

FOREIGN PATENT DOCUMENTS

| | | |
|---|---|---|
| JP | S62-200902 A | 9/1987 |
| JP | H09-18244 A | 1/1997 |
| JP | H10-70428 A | 3/1998 |
| JP | 2002-515196 A | 5/2002 |
| JP | 2004-510376 A | 4/2004 |
| JP | 2006-041936 A | 2/2006 |

(Continued)

OTHER PUBLICATIONS

Japanese Office Action dated Mar. 10, 2015, with a partial English translation.

*Primary Examiner* — Steven J Mottola
(74) *Attorney, Agent, or Firm* — McGinn IP Law Group, PLLC

(57) ABSTRACT

A high-frequency amplifier includes: a first transistor having a source connected to ground; a second transistor forming a cascode circuit with the first transistor; a series circuit connected between a gate of the second transistor and the ground, the series circuit being formed by a first resistive element and a series resonant circuit connected in series with each other; and a second resistive element connected in parallel to the series circuit. The high-frequency amplifier can achieve low distortion characteristics while ensuring operational stability in a wide band.

18 Claims, 12 Drawing Sheets

(56) References Cited

FOREIGN PATENT DOCUMENTS

| | | |
|---|---|---|
| JP | 2010-028739 A | 2/2010 |
| JP | 2010-068261 A | 3/2010 |
| WO | WO 97/05695 A1 | 2/1997 |
| WO | WO 02/27922 A1 | 4/2002 |

* cited by examiner

GaAs MES(2mm)+GaN(1.6mm)

Output Reflection Coefficient freq (40.00MHz to 10.00GHz)

LOW-FREQUENCY BAND SIDE

HIGH-FREQUENCY BAND SIDE

LOW-FREQUENCY BAND SIDE

HIGH-FREQUENCY BAND SIDE

HIGH-FREQUENCY AMPLIFIER

REFERENCE TO RELATED APPLICATION

This application is based upon and claims the benefit of the priority of Japanese patent application No. 2012-047934, filed on Mar. 5, 2012, the disclosure of which is incorporated herein in its entirety by reference thereto. The present invention relates to a high-frequency amplifier. In particular, it relates to a cascode high-frequency amplifier.

TECHNICAL FIELD

Background

A cascode high-frequency amplifier capable of obtaining high power gain is often used as a microwave power amplifier or a millimeter-wave power amplifier in a cable television (CATV), for example. As an example of such high-frequency amplifier, Patent Literature (PTL) 1 discloses a cascode circuit in which two transistors are connected in a cascade fashion. This cascode circuit includes a first transistor having a source or an emitter connected to ground, a second transistor having a source or an emitter connected to a drain or a collector of the first transistor, a signal improvement circuit that is connected to a gate or a base of the second transistor and that improves and outputs an input signal, and a filter circuit that is connected to the signal improvement circuit on a side opposite to the second transistor and that short-circuits a high-frequency signal near a certain frequency. More specifically, the signal improvement circuit is a resistor for controlling reflex gain, and the filter circuit is a series resonant circuit in which an inductor and a capacitor are connected in series with each other. More specifically, the filter circuit is an open-circuited stub or a short-circuited stub.

[Patent Literature 1] Japanese Patent Kokai Publication No. JP2010-68261A

SUMMARY

The following analyses are given by the present invention.

A cascode high-frequency amplifier used in a CATV is required to have good amplification characteristics in a wide band from 40 MHz to 1 GHz, for example. However, an operation simulation executed on the cascode circuit as disclosed in PTL 1 has turned out that the cascode circuit cannot achieve low distortion characteristics while ensuring operational stability in a wide band.

The inventor of the present application analyzed the cascode circuit as disclosed in PTL 1 and found out that load impedance of the first transistor (interstage impedance between the first transistor at an upstream stage and the second transistor at a downstream stage) significantly differs between a low-frequency side and a high-frequency side. Namely, since the load impedance of the first transistor is not affected by the signal improvement circuit and the filter circuit on the low-frequency side because of gate capacitance of the second transistor, the load impedance of the first transistor is approximately 1/gm (gm represents transconductance of the second transistor that is as low as approximately 3Ω, for example). In contrast, on the high-frequency side, impedance of the signal improvement circuit and the filter circuit is dominant via the gate capacitance of the second transistor. Thus, since the load impedance of the first transistor has large frequency dependence, the present inventor has concluded that the cascode circuit as disclosed in PTL 1 cannot achieve low distortion characteristics in a wide band. In view of such circumstances, there is much to be desired in the art.

According to an aspect of the present disclosure, there is provided a high-frequency amplifier comprising: a first transistor having a source connected to ground; a second transistor forming a cascode circuit with the first transistor; a series circuit connected between a gate of the second transistor and the ground, the series circuit being formed by a first resistive element and a series resonant circuit connected in series with each other; and a second resistive element connected in parallel to the series circuit.

The meritorious effects of the present disclosure are summarized as follows. The present disclosure can achieve low distortion characteristics while ensuring operational stability in a wide band.

PREFERRED MODES

Figure 1:
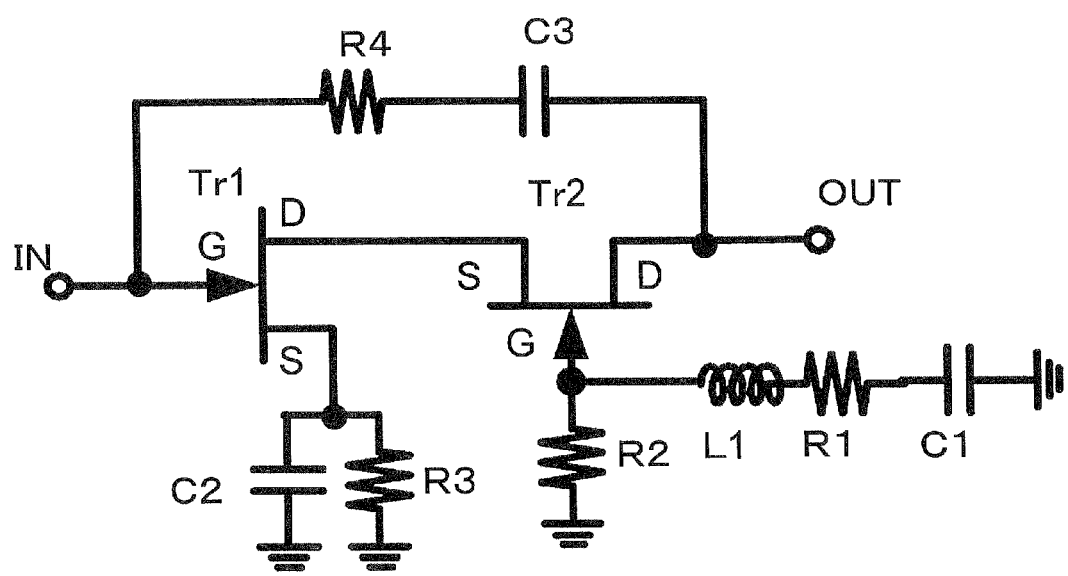
FIG. 1 is a circuit diagram of a high-frequency amplifier according to a first exemplary embodiment of the present disclosure.

Hereinafter, exemplary embodiments of the present disclosure will be summarized. The reference characters in the following summary are merely used as examples to facilitate understanding of the present disclosure. Namely, the reference characters are not intended to limit the present disclosure to the modes as illustrated in the drawings.

A high-frequency amplifier according to an exemplary embodiment of the present disclosure includes: a first transistor (Tr1 in FIG. 1) having a source connected to ground; a second transistor (Tr2 in FIG. 1) forming a cascode circuit with the first transistor; a series circuit connected between a gate of the second transistor and the ground, the series circuit being formed by a first resistive element (R1 in FIG. 1) and a series resonant circuit (corresponding to L1 and C1 in FIG. 1) connected in series with each other; and a second resistive element (R2 in FIG. 1) connected in parallel to the series circuit.

In the high-frequency amplifier, the series resonant circuit may be formed by an LC circuit, and the series circuit may include the first resistive element between LC elements.

In the high-frequency amplifier, the series resonant circuit may be formed by an LC circuit, and the series circuit may include the first resistive element on a ground side.

The high-frequency amplifier may include a plurality of series circuits each having different LC element values, and each of the series circuits may be connected between the gate of the second transistor and the ground.

The high-frequency amplifier may satisfy $1/gm < R1 \le R2 < 30/gm$, provided that resistance values of the first and second resistive elements are R1 and R2, respectively, and transconductance of the second transistor is gm.

In the high-frequency amplifier, the first transistor may be a gallium arsenide metal-semiconductor field effect transistor (GaAs MESFET) or a GaAs hetero junction FET (HJFET) and the second transistor may be a gallium nitride (GaN) FET.

A semiconductor device may include the high-frequency amplifier as disclosed hereinabove.

A system may include two semiconductor devices as described above, and the system may be configured to cause each of the two semiconductor devices to execute a push-pull operation.

With the above high-frequency amplifier, since the second resistive element is present, change of the load impedance of the first transistor by the frequency can be reduced on the high-frequency side. Thus, the high-frequency amplifier can achieve low distortion characteristics while ensuring operational stability in a wide band.

Next, exemplary embodiments will be described in detail with reference to the drawings.

Exemplary Embodiment 1

FIG. 1 is a circuit diagram of a high-frequency amplifier according to a first exemplary embodiment of the present disclosure. In FIG. 1, the high-frequency amplifier includes transistors Tr1 and Tr2, resistive elements R1 to R4, capacitative elements (capacitors, C-elements) C1 to C3, an inductive element (an inductor, an L-element) L1, an input node IN, and an output node OUT.

For example, the transistor Tr1 is a gallium arsenide metal-semiconductor field effect transistor (GaAs MESFET) or a GaAs hetero junction FET. The transistor Tr1 has a drain connected to a source of the transistor Tr2, a gate connected to the input node IN, and a source connected to ground via a parallel circuit of the resistive element R3 and the capacitive element C2. Namely, the transistor Tr1 serves as a source-grounded transistor.

For example, the transistor Tr2 is a high-voltage gallium nitride field effect transistor (GaN FET). The transistor Tr2 has a drain connected to the output node OUT and a gate connected to ground via a series circuit (LCR circuit) of the inductive element L1, the resistive element R1, and the capacitive element C1 and via the resistive element R2. Namely, the transistor Tr2 serves as a gate-grounded transistor effectively.

These transistors Tr1 and Tr2 form upstream-stage and downstream-stage transistors of the cascode circuit, respectively. The series circuit of the resistive element R4 and the capacitive element C3 are connected as a feedback circuit between the input node IN and the output node OUT.

It is preferable that constants of the inductive element L1 and the capacitive element C1 in the LCR circuit be set to satisfy a series resonance condition indicated by expression (1) using frequency fh on the high-frequency side of an amplifier use frequency band.

$$L \cdot C = 1/(2\pi \cdot fh)^2 \qquad (1)$$

In expression (1), L denotes inductance of the inductive element L1, C denotes capacitance of the capacitive element C1, and fh denotes frequency on the high-frequency side of an amplification band.

In addition, as indicated by the following expression (2), it is preferable that the value of the resistive element R1 in the LCR circuit be set to be less than or equal to the value of the resistive element R2 via which the gate of the transistor Tr2 is virtually grounded, so that change of the interstage impedance between the upstream and downstream stages is reduced.

$$R1 \le R2 \qquad (2)$$

Interstage impedance Zin having a cascode configuration is expressed by the following expression (3) using transconductance gm of the transistor Tr2, gate-source admittance $y_{gs}$, drain-source admittance $y_{ds}$, and value $R_g$ of the resistive element R2 via which the gate of the downstream transistor is virtually grounded.

$$Z_{in} = \cfrac{1}{gm + \cfrac{y_{gs}}{1 + R_g \cdot y_{gs}} + y_{ds}} \qquad (3)$$

From expression (3), the interstage impedance Zin can be approximated to 1/gm and Rg at the low and high frequencies, respectively. As a result, unless the lower limit of the value of the resistive element R1 is 1/gm or more, loss is not recognized. Thus, stability is degraded.

Assuming that an increase of the interstage impedance causes deterioration of high-frequency distortion characteristics with respect to low-frequency distortion characteristics, it is desirable that the interstage impedance at the high frequency be 1/gm. Namely, it is preferable that the upper limit of the value of the resistive element R1 also be approximately 1/gm. However, a wider allowable range can be set. For example, regarding a CATV signal, to achieve a tilt of 10 dB from the low frequency to the high frequency, high-frequency-side distortion characteristics are improved accordingly, and deterioration of the distortion characteristics can be allowed. If the high-frequency-side impedance allows impedance 30 times higher than the low-frequency-side impedance, namely, a value as much as +15 dB, the upper limit of the value of the resistive element R1 is 30/gm.

Thus, if the resistance values of the resistive elements R1 and R2 are R1 and R2 (=Rg) and the transconductance of the transistor Tr2 is gm, it is preferable that R1 and R2 satisfy the following expression (4). For example, if the transistor Tr2 is a GaN FET having a gate width of 1.6 mm and $1/gm \approx 3\Omega$, $30/gm \approx 90\Omega$.

$$1/gm < R1 \le R2 < 30/gm \qquad (4)$$

Figure 2:
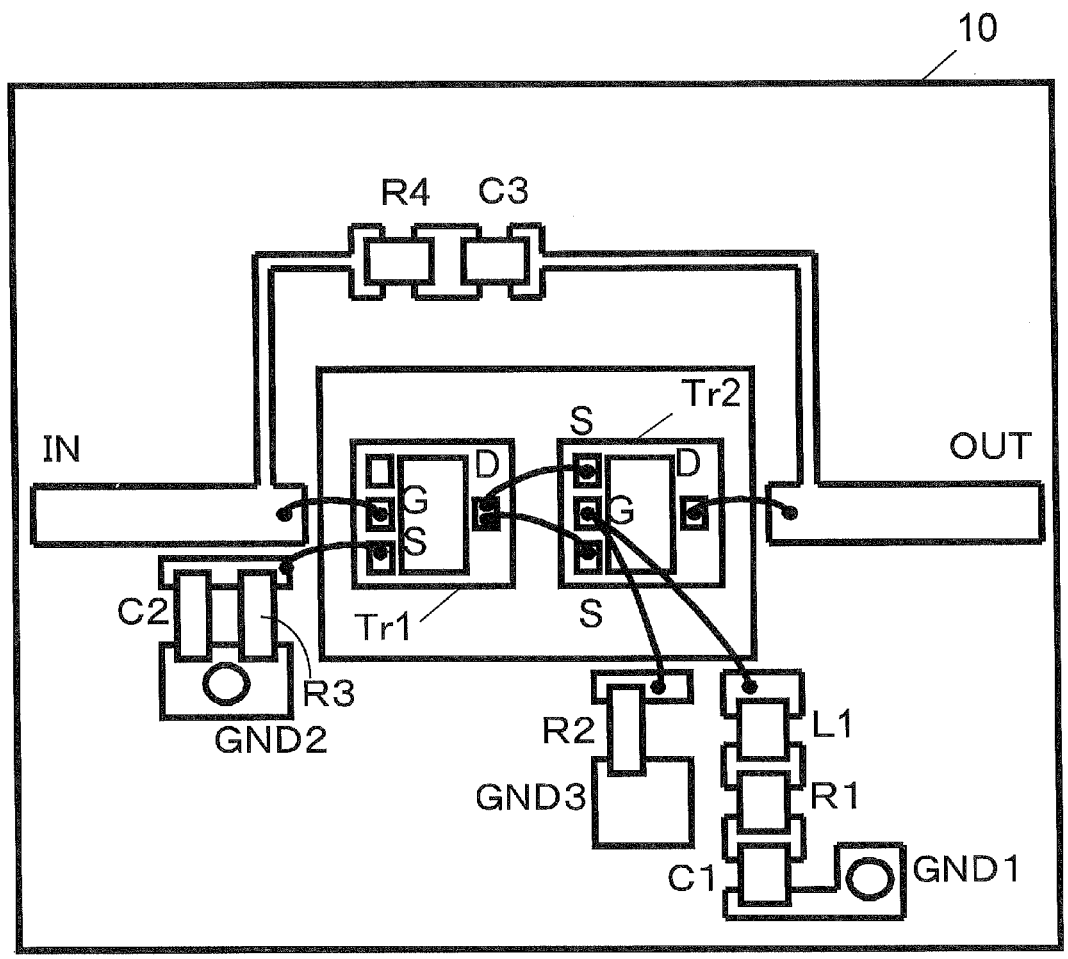
FIG. 2 illustrates an implementation example of the high-frequency amplifier according to the first exemplary embodiment of the present disclosure.

Next, implementation of the high-frequency amplifier will be described. FIG. 2 illustrates an implementation example of the high-frequency amplifier according to the first exemplary embodiment. In FIG. 2, reference characters identical to those in FIG. 1 represent identical elements. Each element illustrated in the circuit diagram in FIG. 1 is arranged on a dielectric circuit substrate 10. The transistor Tr1 used as the upstream-stage transistor chip and the transistor Tr2 used as the downstream-stage transistor chip are connected by bonding wires. In addition, the transistors Tr1 and Tr2 are connected to various elements by bonding wires. A low distortion GaAs MESFET or GaAs hetero junction FET (HJFET) is used as the transistor Tr1 having a source connected to a virtual ground GND2, which is a via hole. A high-voltage GaN FET is used as the downstream-stage transistor Tr2.

The drain of the transistor Tr2 and the gate node of the transistor Tr1 are connected by a feedback circuit formed by a series circuit of the chip-shaped resistive element R4 and the chip-shaped capacitive element C3 arranged on the dielectric circuit substrate 10. In addition, the gate of the transistor Tr2 is connected to a virtual ground GND3, which is a via hole, via the chip-shaped resistive element R2. In addition, an LCR series circuit of the chip-shaped inductive element L1, the chip-shaped resistive element R1, and the chip-shaped capacitive element C1 satisfying the above expressions (1) and (4) is connected in parallel to the resistive element R2 via which transistor Tr2 is connected to the virtual ground GND3. While the inductive element L1 is described as a chip-shaped element, the inductive element L1 may be formed by a bonding wire. The virtual grounds GND1 to GND3 are directly connected to ground or substantially connected to ground in a use frequency band via a capacitative element or the like.

Next, various characteristics of the high-frequency amplifier having the above configuration will be compared with those of a conventional technique.

Figure 3A:
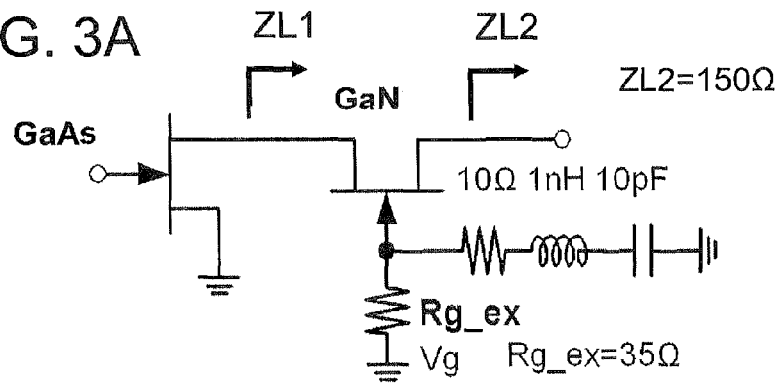
FIGS. 3A and 3B are an equivalent circuit and a Smith chart of the high-frequency amplifier according to the first exemplary embodiment of the present disclosure, respectively.
Figure 3B:
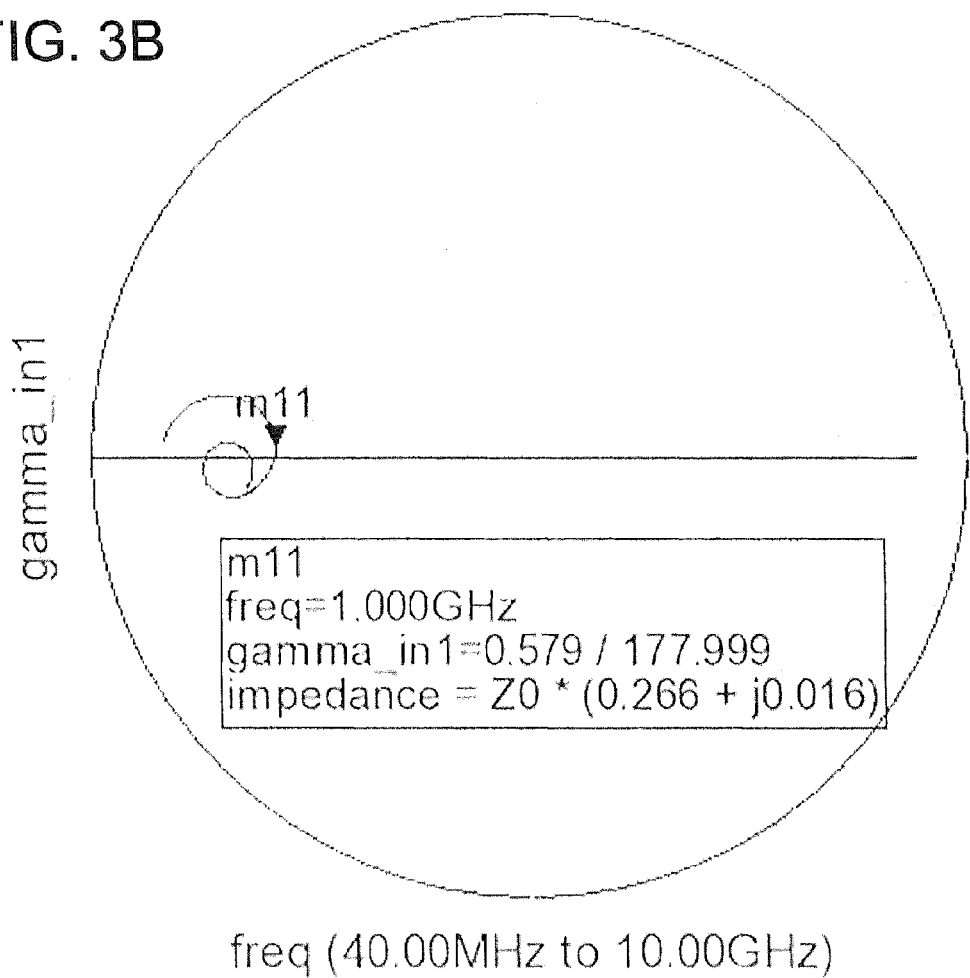

FIG. 3A is an equivalent circuit of the high-frequency amplifier according to the present exemplary embodiment. The high-frequency amplifier is formed as a cascode amplifier by using a GaAs MESFET having a gate width of 2 mm as the transistor Tr1 and a GaN FET having a gate width of 1.6 mm as the transistor Tr2. FIG. 3B is a Smith chart illustrating frequency characteristics of load impedance (interstage impedance) ZL1 of the transistor Tr1. Since the LCR series circuit (L=1 nH, R=10Ω, C=10 pF) serving as a series resonance condition on the high-frequency side is connected in parallel to a virtually-grounded gate resistor (35Ω) corresponding to the resistive element R2, the load impedance ZL1 of the transistor Tr1 is low on the high-frequency side.

Thus, since change in interstage impedance ZL1 between the upstream and downstream stages is reduced on the high-frequency side, it is possible to achieve low distortion characteristics while ensuring operational stability in a wider band. With such configuration, it is possible to reduce frequency dependence of the interstage impedance ZL1 between the upstream and downstream stages.

Figure 4A:
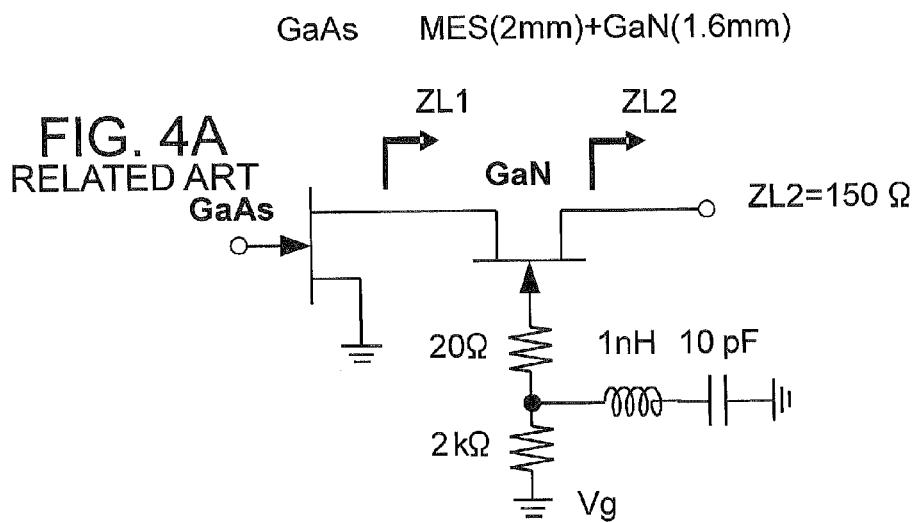
FIGS. 4A and 4B are an equivalent circuit and a Smith chart of a high-frequency amplifier according to a related art, respectively.
Figure 4B:
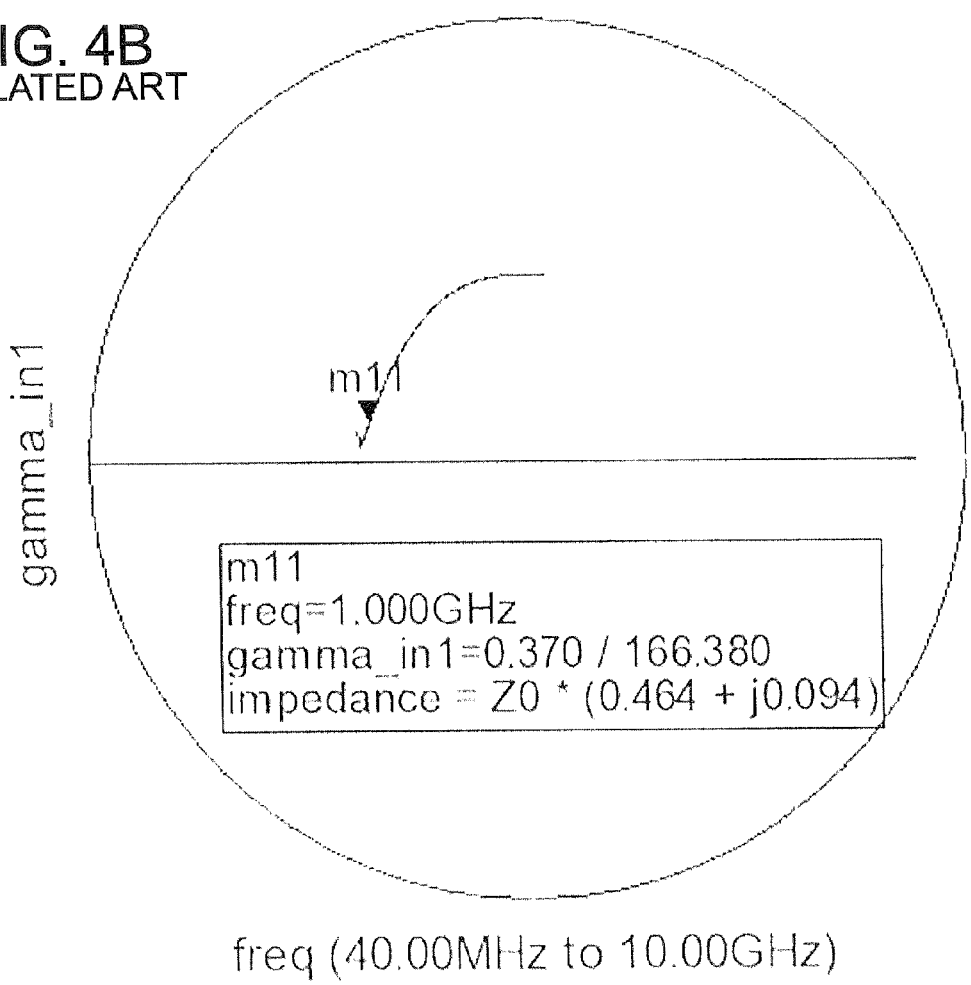

FIG. 4A is an equivalent circuit of a high-frequency amplifier formed as a cascode amplifier according to a related art. Unlike the circuit in FIG. 3A, the resistive element R2 is removed, and the value of a resistive element corresponding to the resistive element R1 is 20Ω as disclosed in PTL 1. FIG. 4B is a Smith chart illustrating frequency characteristics of load impedance ZL1 of the transistor Tr1 of such high-frequency amplifier. It is seen that change of the interstage impedance ZL1 between the upstream and downstream stages is larger than that in FIG. 3B.

Figure 5A:
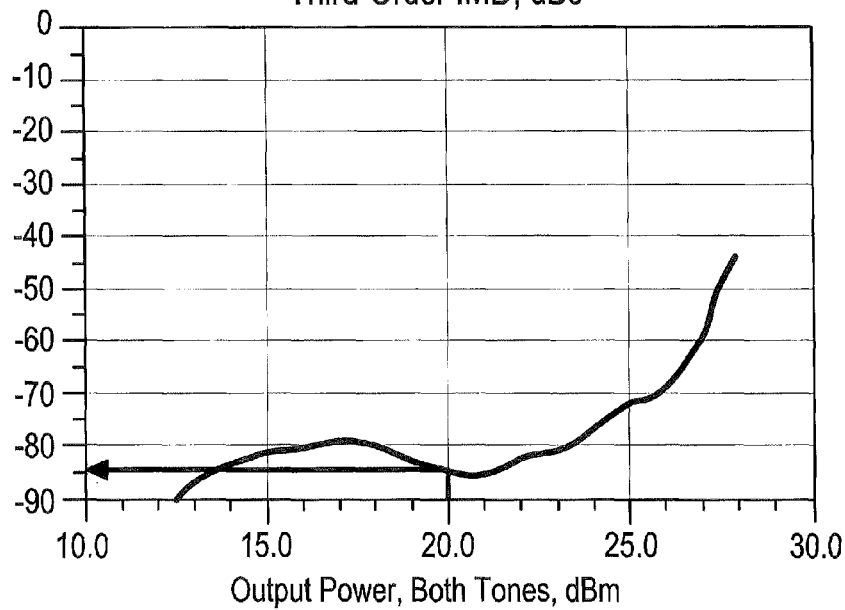
FIGS. 5A and 5B illustrate distortion characteristics (third-order inter-modulation distortion-output) of the high-frequency amplifier according to the first exemplary embodiment of the present disclosure.
Figure 5B:
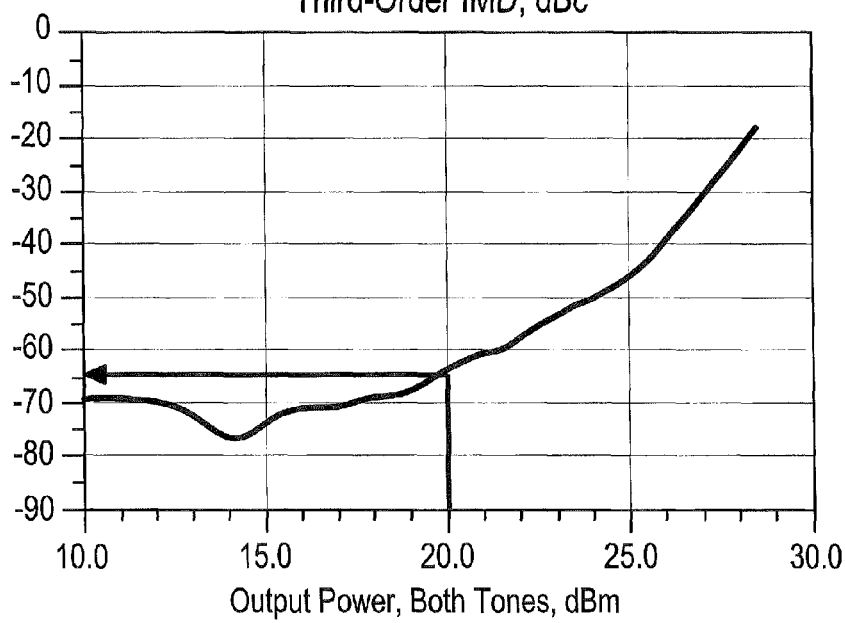
Figure 6A:
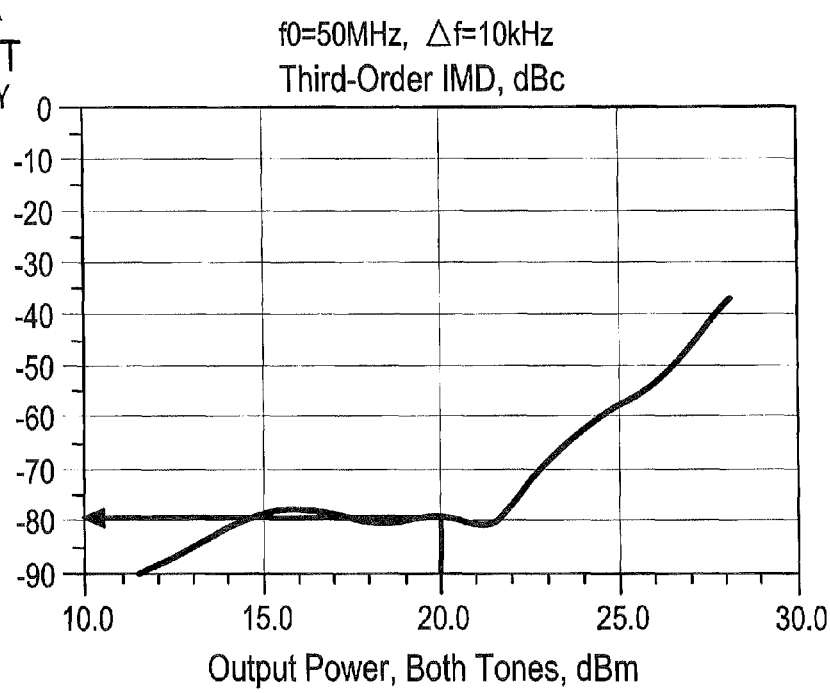
FIGS. 6A and 6B illustrate distortion characteristics (third-order inter-modulation distortion-output) of the high-frequency amplifier according to the related art.
Figure 6B:
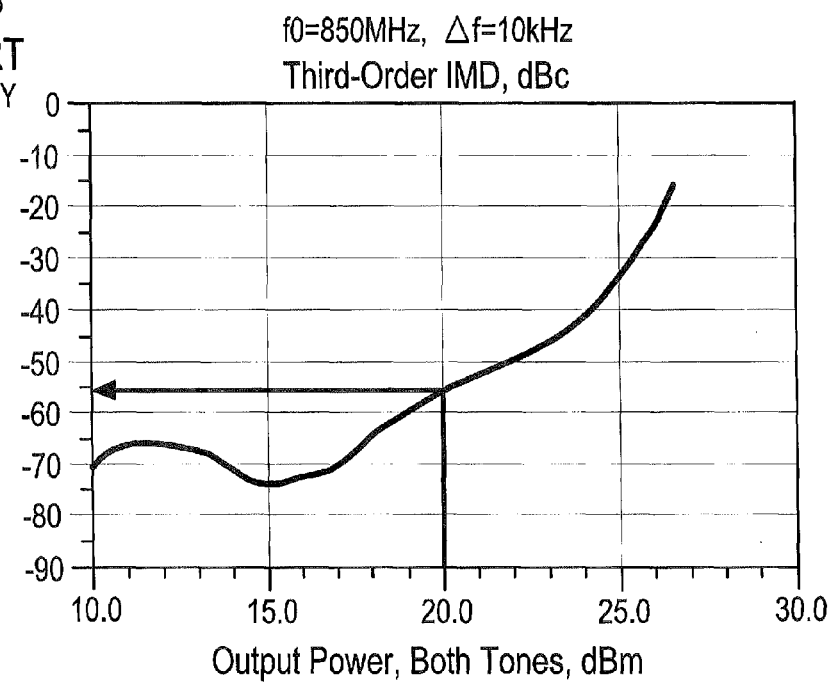

In addition, FIGS. 5A and 5B illustrate distortion characteristics (third-order inter-modulation distortion-output) of the high-frequency amplifier according to the present exemplary embodiment. FIG. 5A illustrates distortion characteristics on the low-frequency side (input of two waves of 50 MHz±Δf/2, Δf=10 kHz) and FIG. 5B illustrates distortion characteristics on the high-frequency side (input of two waves of 850 MHz±Δf/2, Δf=10 kHz). FIG. 6 illustrates distortion characteristics of the high-frequency amplifier according to the conventional technique. It is seen from these figures that the distortion characteristics of the high-frequency amplifier according to the present exemplary embodiment are improved by approximately 5 dB and 10 dB on the low- and high-frequency sides, respectively, as compared with those according to the conventional technique.

Figure 7A:
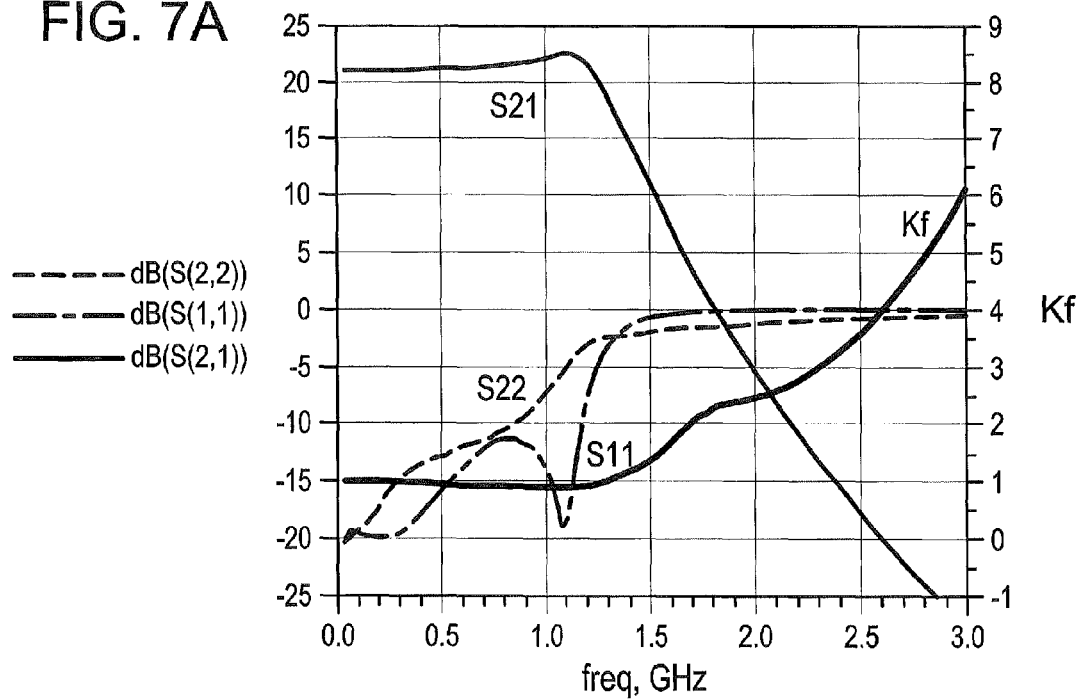
FIGS. 7A and 7B illustrate S-parameters and stability factor Kf of the high-frequency amplifier according to the first exemplary embodiment of the present disclosure and of the conventional high-frequency amplifier, respectively.
Figure 7B:
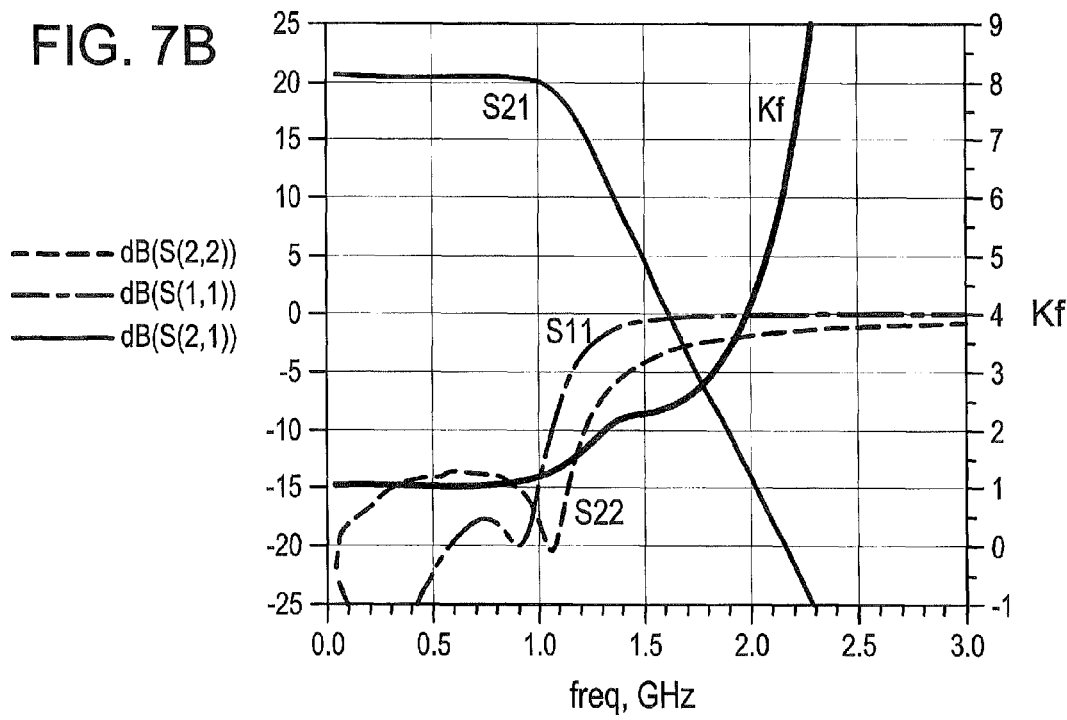

In addition, FIGS. 7A and 7B illustrate S-parameters and stability factor Kf of these high-frequency amplifiers. FIG. 7A illustrates S-parameters and stability factor Kf of the high-frequency amplifier according to the present exemplary embodiment. FIG. 7B illustrates S-parameters and stability factor Kf of the high-frequency amplifier according to the conventional technique. For example, as represented by characteristics S21, the high-frequency amplifier according to the present exemplary embodiment can achieve gain in a wider band while ensuring stability (Kf>1), as compared with the conventional technique.

Figure 11:
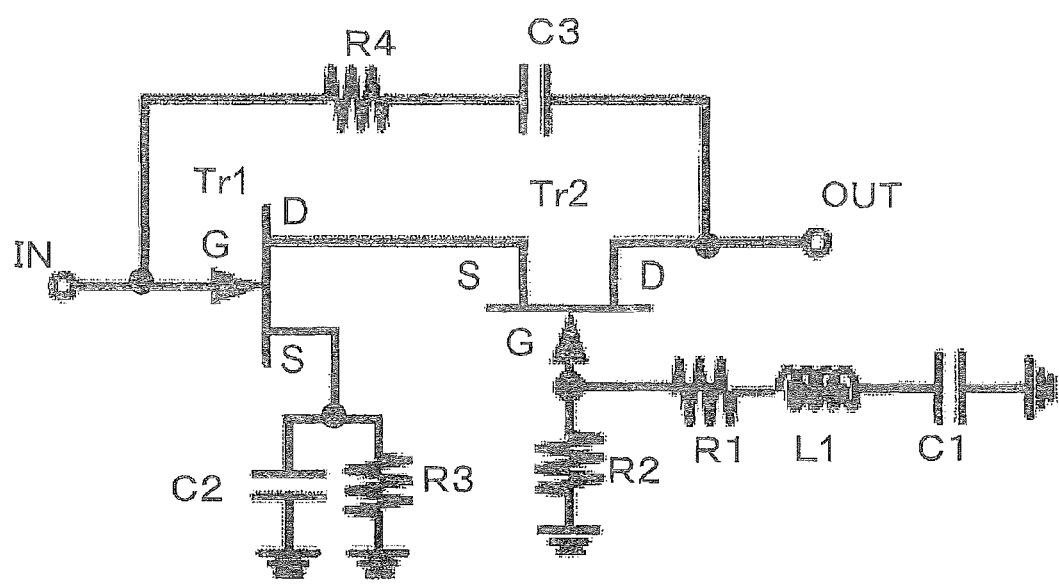
FIGS. 11 and 12 show alternative interconnections for the RCL circuit connected at the gate of the second transistor Tr2.
Figure 12:
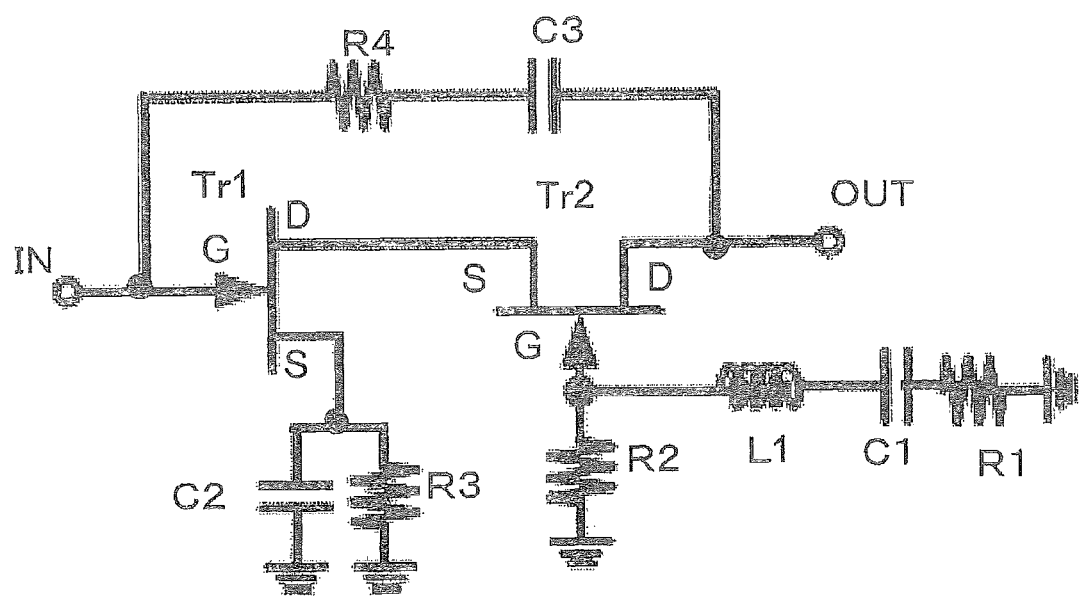

In the high-frequency amplifier according to the present exemplary embodiment, the resistive element R1 is inserted between the inductive element L1 and the capacitive element C1. However, the present disclosure is not limited to such example. As long as a series circuit is equivalently formed by the resistive element R1, the inductive element L1, and the capacitive element C1, the circuit operates as the same equivalent circuit. Thus, the resistive element R1 may be inserted on the ground side (see FIG. 11) or on the gate node side of the transistor Tr2 (see FIG. 12), to form the series circuit with the inductive element L1 and the capacitive element C1. Thus, by appropriately selecting the insertion position of the resistive element R1, freedom of deigning components can be improved, and as a result, downsizing can be achieved.

Exemplary Embodiment 2

Figure 8:
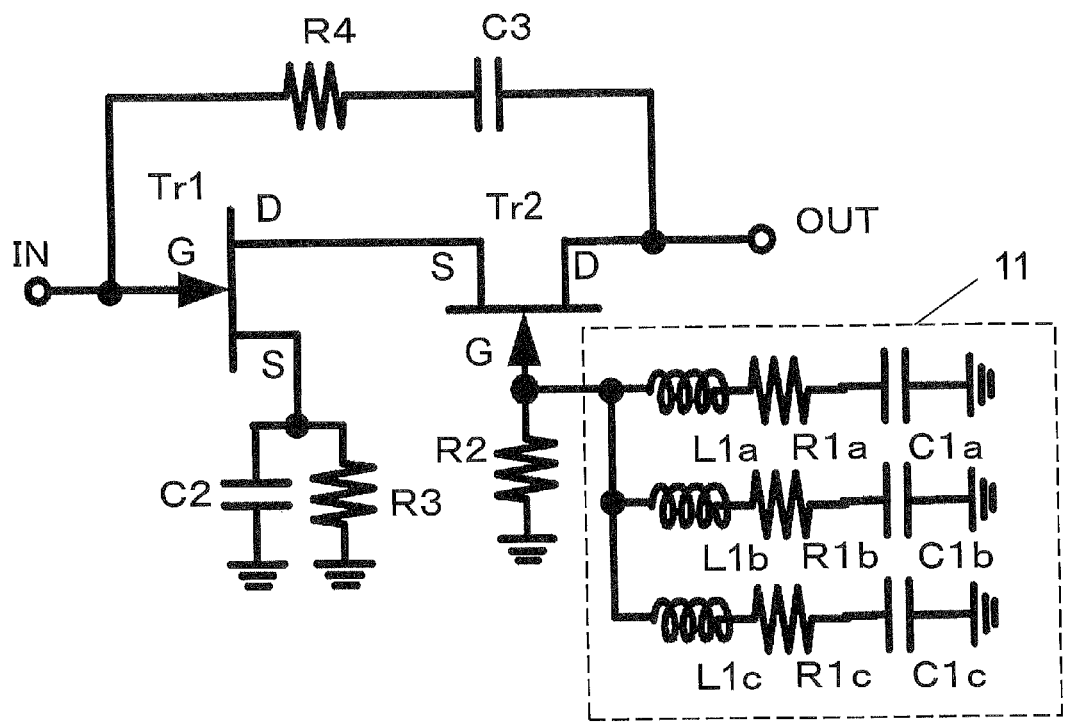
FIG. 8 is a circuit diagram of a high-frequency amplifier according to a second exemplary embodiment of the present disclosure.

FIG. 8 is a circuit diagram of a high-frequency amplifier according to a second exemplary embodiment of the present disclosure. In FIG. 8, reference characters identical to those in FIG. 1 represent identical elements, and description thereof will be omitted. In the high-frequency amplifier according to the present exemplary embodiment, an LCR series circuit group 11 is connected in parallel to the resistive element R2 connected to the gate of the transistor Tr2. The LCR series circuit group 11 is formed by connecting: a series circuit (an LCR circuit) of an inductive element L1a, a resistive element R1a, and a capacitive element C1a; a series circuit (an LCR circuit) of an inductive element L1b, a resistive element R1b, and a capacitive element C1b; and a series circuit (an LCR circuit) of an inductive element L1c, a resistive element R1c, and a capacitive element C1c in parallel to each other.

Constants of the L- and C-elements in each of the three LCR series circuits in the LCR series circuit group 11 are set so that each pair satisfies a series resonance condition at a different frequency. In addition, each of the resistive elements in the three LCR series circuits may be set to have a different value, as long as the value is lower than or equal to the value of the resistive element R2 via which the transistor Tr2 is virtually grounded. In a frequency satisfying a series resonance condition, as in exemplary embodiment 1, the interstage impedance between the upstream and downstream stages is reduced. Thus, the frequency dependence of the interstage impedance can be reduced in an even wider band. As a result, the distortion of the amplifier can be stably lowered even in a wider band.

In the above description, the LCR series circuit group 11 is formed by three LCR series circuits. However, the present disclosure is not limited to such example. It is needless to say that the LCR series circuit group 11 may be formed by two or more LCR series circuits so that predetermined characteristics can be obtained in a desired frequency band.

Exemplary Embodiment 3

Figure 9:
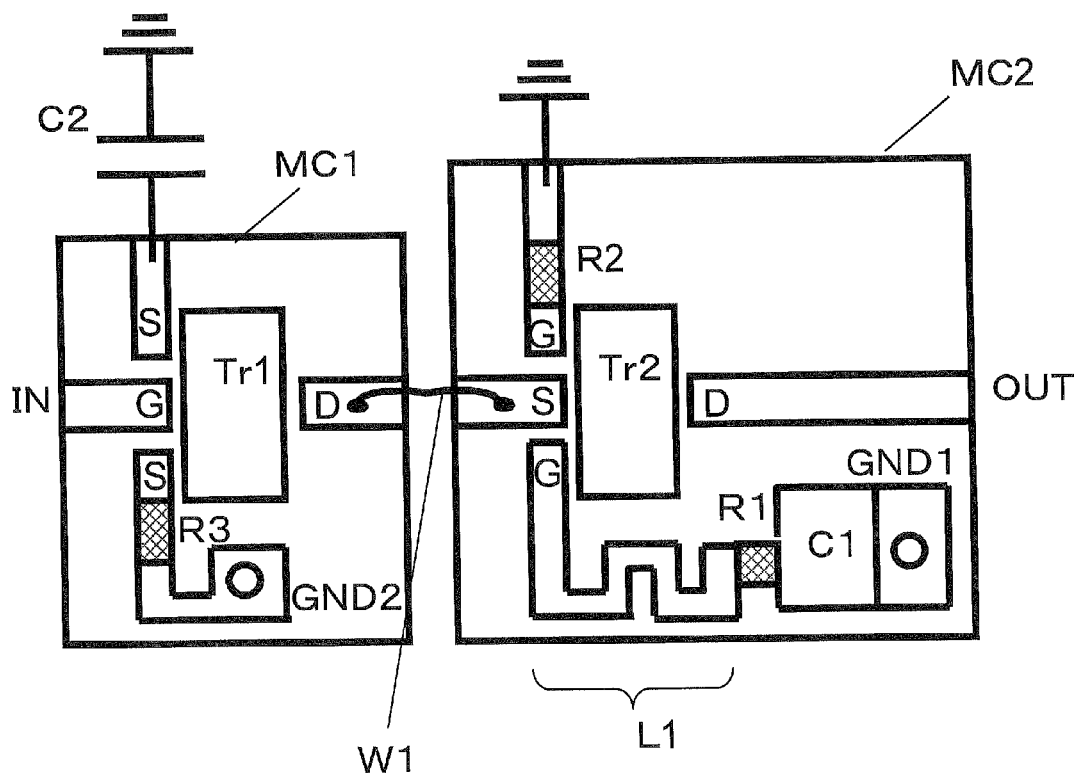
FIG. 9 illustrates an implementation example of a high-frequency amplifier according to a third exemplary embodiment of the present disclosure.

FIG. 9 is an implementation example of a high-frequency amplifier according to a third exemplary embodiment of the present disclosure. In FIG. 9, reference characters identical to those in FIG. 2 represent identical elements, and description thereof will be omitted. The high-frequency amplifier according to the present exemplary embodiment includes microwave monolithic integrated circuits (MCs) 1 and 2 and an external capacitive element C2. The transistor Tr1 and the resistive element R3 are mounted on the MC 1. The transistor Tr2, the resistive elements R1 and R2, the inductive element L1, and the capacitive element C1 are mounted on the MC 2. The drain D of the transistor Tr1 and the sources of the transistor Tr2 are connected via a bonding wire W1. In FIG. 9, no feedback circuit is required.

A high-frequency amplifier having such configuration enables accurate designing and fabrication easily. As a result, circuit downsizing can be achieved.

In the case of a millimeter-wave high-frequency amplifier, the LC circuit can be formed as an open-circuited stub or a short-circuited stub. If an open-circuited stub is used, the insertion position of the resistive element R1 is limited to the gate side of the transistor Tr2. If a short-circuited stub is used, the insertion position of the resistive element R1 is limited to the gate side of the transistor Tr2 or to the ground side.

Exemplary Embodiment 4

Figure 10:
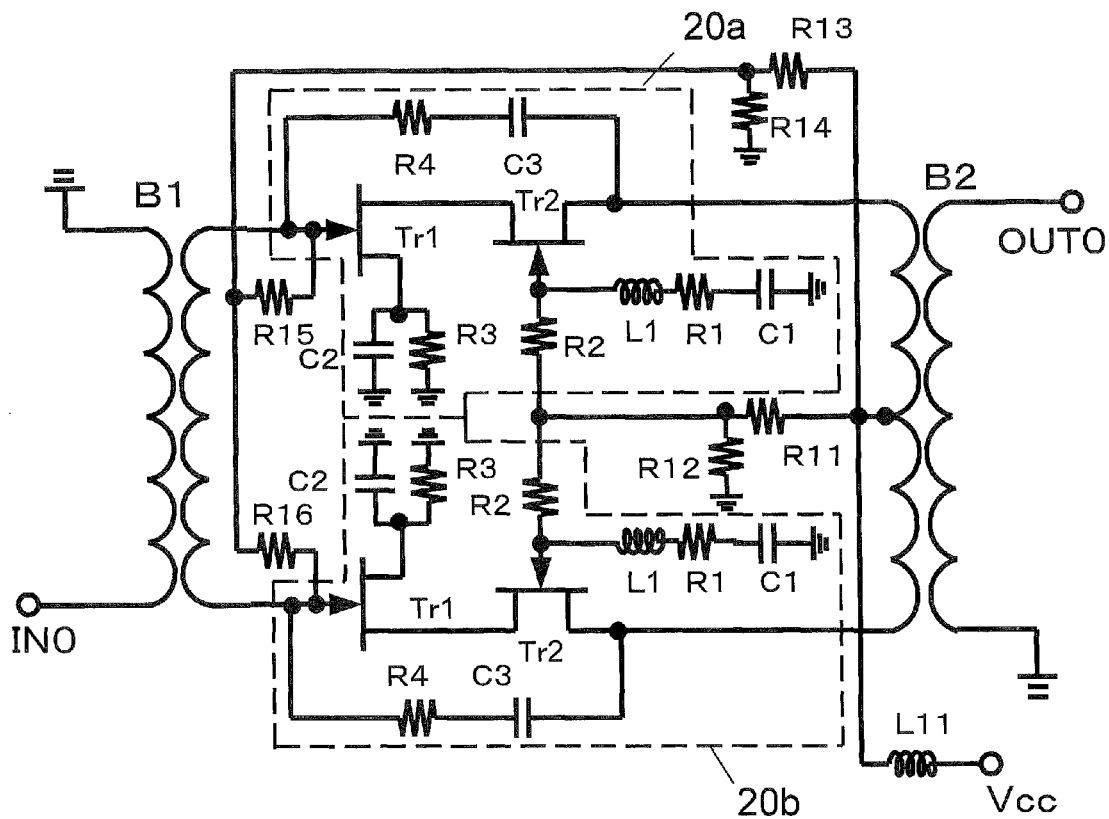
FIG. 10 is a circuit diagram of a system according to a fourth exemplary embodiment of the present disclosure.

FIG. 10 is a circuit diagram of a system according to a fourth exemplary embodiment of the present disclosure. In FIG. 10, reference characters identical to those in FIG. 1 represent identical elements, and description thereof will be omitted. The system according to the present exemplary embodiment includes high-frequency amplifiers 20*a* and 20*b*, resistive elements R11 to R16, baluns (transformers) B1 and B2, an inductive element L11, an input node IN0, and an output node OUT0. The high-frequency amplifiers 20*a* and 20*b* have the same configuration as that of the high-frequency amplifier illustrated in FIG. 1.

One end of the input winding of the balun B1 is connected to ground, and the other end is connected to the input node IN0. Both ends of the output winding of the balun B1 are connected to the gates of the transistors Tr1 of the respective high-frequency amplifiers 20*a* and 20*b*.

Both ends of the input winding of the balun B2 are connected to the drains of the transistors Tr2 in the respective high-frequency amplifiers 20*a* and 20*b*. One end of the output winding of the balun B2 is connected to ground, and the other end is connected to the output node OUT0.

A power supply Vcc is given to a midpoint of the input winding (coil) of the balun B2 via the inductive element L11 blocking an AC component of a signal. In addition, the midpoint of the input winding of the balun B2 is divided by series connection of the resistive elements R11 and R12, and the division point is connected to the resistive elements R2 in the high-frequency amplifiers 20*a* and 20*b* on the virtual ground side. In addition, the midpoint of the input winding of the balun B2 is divided by series connection of the resistive elements R13 and R14, and the division point is connected to the gates of the transistors Tr1 in the high-frequency amplifiers 20*a* and 20*b* via the resistive elements R15 and R16, respectively.

In the system having such configuration, the power supply Vcc is supplied to the high-frequency amplifiers 20*a* and 20*b* via the inductive element L11. A potential at the division point of the resistive elements R13 and R14 is applied to the gates of the transistors Tr1 as a bias. In addition, a potential at the division point of the resistive elements R11 and R12 is applied to the gates of the transistors Tr2 as a bias.

In this system as described above, the high-frequency amplifiers 20*a* and 20*b* are connected in parallel to each other, and the system is configured to execute a push-pull operation by using the baluns (transformers) B1 and B2, with signals inputted to and outputted from these high-frequency amplifiers 20*a* and 20*b*. With this system, an output amplitude that reaches saturation is doubled by a push-pull operation. In addition, second-order distortion of an output signal is canceled by a push-pull operation. Such system is suitable for a CATV module that operates in a wide band from 40 MHz to 1 GHz, for example.

The entire disclosure of the above PTL and the like is incorporated herein by reference thereto. Modifications and adjustments of the exemplary embodiments and examples are possible within the scope of the overall disclosure (including the claims) of the present disclosure and based on the basic technical concept of the present disclosure. Various combinations and selections of various disclosed elements (including the elements in each of the claims, examples, drawings, etc.) are possible within the scope of the claims of the present disclosure. That is, the present disclosure of course includes various variations and modifications that could be made by those skilled in the art according to the overall disclosure including the claims and the technical concept.

What is claimed is:

1. A high-frequency amplifier, comprising:
a first transistor having a source connected to ground;
a second transistor forming a cascode circuit with the first transistor;
a series circuit connected between a gate of the second transistor and the ground, the series circuit being formed by a first resistive element and a series resonant circuit connected in series with each other; and
a second resistive element connected in parallel to the series circuit,
wherein, the high-frequency amplifier satisfies $1/gm < R1 \leq R2 < 30/gm$, provided that resistance values of the first and second resistive elements are R1 and R2, respectively, and a transconductance of the second transistor is gm.

2. The high-frequency amplifier according to claim 1, wherein the series resonant circuit is formed by an LC circuit, and the series circuit includes the first resistive element between LC elements.

3. The high-frequency amplifier according to claim 1, wherein the series resonant circuit is formed by an LC circuit, and the series circuit includes the first resistive element inserted on a ground side of the LC circuit.

4. The high-frequency amplifier according to claim 2, comprising:
a plurality of series circuits each having different LC element values,
wherein each of the series circuits is connected between the gate of the second transistor and the ground.

5. The high-frequency amplifier according to claim 3, comprising:

a plurality of series circuits each having different LC element values,
wherein each of the series circuits is connected between the gate of the second transistor and the ground.

6. A high-frequency amplifier, comprising:
a first transistor having a source connected to ground;
a second transistor forming a cascode circuit with the first transistor;
a series circuit connected between a gate of the second transistor and the ground, the series circuit being formed by a first resistive element and a series resonant circuit connected in series with each other; and
a second resistive element connected in parallel to the series circuit,
wherein the first transistor is a GaAs MESFET or a GaAs hetero junction FET and the second transistor is a GaN FET.

7. The high-frequency amplifier according to claim 6, wherein, the high-frequency amplifier satisfies $1/gm < R1 \leq R2 < 30/gm$, provided that resistance values of the first and second resistive elements are R1 and R2, respectively, and a transconductance of the second transistor is gm.

8. The high-frequency amplifier according to claim 2, wherein the first transistor is a GaAs MESFET or a GaAs hetero junction FET and the second transistor is a GaN FET.

9. The high-frequency amplifier according to claim 1, wherein the first transistor is a GaAs MESFET or a GaAs hetero junction FET and the second transistor is a GaN FET.

10. A semiconductor device, comprising the high-frequency amplifier according to claim 1.

11. A semiconductor device, comprising the high-frequency amplifier according to claim 2.

12. A semiconductor device, comprising the high-frequency amplifier according to claim 3.

13. A system, comprising two semiconductor devices according to claim 10,
wherein the system is configured to cause each of the two semiconductor devices to execute a push-pull operation.

14. A system, comprising two semiconductor devices according to claim 11,
wherein the system is configured to cause each of the two semiconductor devices to execute a push-pull operation.

15. A system, comprising two semiconductor devices according to claim 12,
wherein the system is configured to cause each of the two semiconductor devices to execute a push-pull operation.

16. The high-frequency amplifier according to claim 1, wherein the series circuit is formed by serially interconnecting an inductance element L, a capacitance element C, and a resistance element R in any predetermined order.

17. The high-frequency amplifier according to claim 1, further comprising:
an input terminal; and
an output terminal,
wherein the first transistor comprises a gate, which is connected to the input terminal, and the second transistor comprises a drain, which is connected to the output terminal.

18. The high-frequency amplifier according to claim 17, further comprising a third resistive element and a capacitive element serially interconnected between the input terminal and the output terminal, wherein the ground connection of the source of the first transistor occurs via a parallel circuit of a resistive element and a capacitive element.

* * * * *